(12) United States Patent
Dan et al.

(10) Patent No.: US 10,957,947 B2
(45) Date of Patent: Mar. 23, 2021

(54) HIGH-VOLTAGE DETECTION CIRCUIT, DETECTOR, BATTERY DEVICE AND VEHICLE

(71) Applicant: CONTEMPORARY AMPEREX TECHNOLOGY CO., LIMITED, Ningde (CN)

(72) Inventors: Zhimin Dan, Ningde (CN); Yizhen Hou, Ningde (CN); Zhanyu Sun, Ningde (CN); Jiechao Luo, Ningde (CN); Jia Xu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 257 days.

(21) Appl. No.: 16/166,448

(22) Filed: Oct. 22, 2018

(65) Prior Publication Data
US 2019/0118668 A1 Apr. 25, 2019

(51) Int. Cl.
*H01M 10/48* (2006.01)
*B60L 58/10* (2019.01)
(Continued)

(52) U.S. Cl.
CPC ......... *H01M 10/486* (2013.01); *B60L 3/0046* (2013.01); *B60L 50/66* (2019.02);
(Continued)

(58) Field of Classification Search
None
See application file for complete search history.

(56) References Cited

U.S. PATENT DOCUMENTS

| 5,642,030 | A | * | 6/1997 | Seelye | ................. | H02J 7/0031 |
| | | | | | | 320/101 |
| 6,356,467 | B1 | * | 3/2002 | Belehradek, Jr. | ....... | H02M 7/48 |
| | | | | | | 363/24 |

(Continued)

FOREIGN PATENT DOCUMENTS

| EP | 2043218 A2 | 4/2009 |
| EP | 2412581 A1 | 2/2012 |

(Continued)

OTHER PUBLICATIONS

Partial European Search Report dated Jun. 14, 2019, Application No. EP18201811.

*Primary Examiner* — Paresh Patel
(74) *Attorney, Agent, or Firm* — The Dobrusin Law Firm, P.C.

(57) ABSTRACT

The present invention provides a high-voltage detection circuit, detector, battery device and vehicle, the high-voltage detection circuit includes: a controller including a first signal input port, a second signal input port, and a signal output port; a current detection sub-circuit for sampling a current signal of internal side of a main negative switch and for transmitting the current signal to the first signal input port; a switch detection sub-circuit, a first end of the switch detection sub-circuit being configured to sample a first electric signal of external side of a to-be-detected switch, and a second end of the switch detection sub-circuit being configured to transmit the first electric signal to the second signal input port; and a switch driving sub-circuit, configured for sampling a switch control signal via the signal output port and generating a switch driving signal according to the switch control signal.

13 Claims, 6 Drawing Sheets

(51) Int. Cl.
    *B60L 50/60*         (2019.01)
    *G01R 19/165*       (2006.01)
    *H01M 10/42*        (2006.01)
    *G01R 31/36*        (2020.01)
    *B60L 3/00*          (2019.01)
    *H03K 17/082*       (2006.01)

(52) U.S. Cl.
    CPC ............ *B60L 58/10* (2019.02); *G01R 19/165* (2013.01); *G01R 19/16542* (2013.01); *G01R 31/36* (2013.01); *H01M 10/42* (2013.01); *H01M 10/425* (2013.01); *H01M 10/48* (2013.01); *B60L 2240/545* (2013.01); *B60L 2240/547* (2013.01); *B60L 2240/549* (2013.01); *H01M 2010/4271* (2013.01); *H03K 17/0822* (2013.01); *Y02T 10/70* (2013.01); *Y02T 10/92* (2013.01)

(56) References Cited

U.S. PATENT DOCUMENTS

2009/0085516 A1\* 4/2009 Emori .................. B60L 3/0046
                                                                                             320/118
2013/0147423 A1\* 6/2013 Sutardja ............ H03K 19/0016
                                                                                             320/107

FOREIGN PATENT DOCUMENTS

| | | | |
|---|---|---|---|
| EP | 3154150 A1 | 4/2017 | |
| GB | 2534314 A \* | 7/2016 | ............. B60L 58/21 |
| GB | 2534314 A | 7/2016 | |

\* cited by examiner

US 10,957,947 B2

HIGH-VOLTAGE DETECTION CIRCUIT, DETECTOR, BATTERY DEVICE AND VEHICLE

CROSS-REFERENCE TO RELATED APPLICATIONS

The present application claims priority to Chinese Patent Application No. 201710993271.5, filed on Oct. 23, 2017, the content of which is incorporated herein by reference in its entirety.

TECHNICAL FIELD

The present invention relates to the technical field of batteries and, in particular, to a high-voltage detection circuit, a detector, a battery device and a vehicle.

BACKGROUND

At present, the substitution from fuel vehicles to electric vehicles has become a developing trend in the automobile industry. However, the safety of vehicle batteries has become one of the problems that impede the promotion of electric vehicles. Now then, in order to reduce the safety risk of the high-voltage loop of the vehicle battery during operation, parameters of status of each relay in the high-voltage loop needs to be detected, so that the battery can be protected by adjusting the high-voltage loop when unsafe factors are detected.

In the related art, the detection circuit for each parameter in the high-voltage loop of the vehicle battery is connected to a battery management unit (Battery Management Unit, BMU) of a low-voltage section of the vehicle battery and is controlled by the BMU, so that a harness is required for connecting the low-voltage section to the high-voltage loop.

In order to allow both the low-voltage section and the high-voltage loop to work normally, an isolation unit is required for isolating the low-voltage section from the high-voltage loop. However, such a circuit design is complicated and error-prone, and the cost of the isolation unit is quite high.

Therefore, at least one technical problem exists in the related art, that is, the internal circuit structure of a vehicle battery is excessively complicated.

SUMMARY

The present invention provides a high-voltage detection circuit, a detector, a battery device and a vehicle, so as to solve the technical problem existing in the related art that the internal circuit structure of a vehicle battery is excessively complicated, so that the internal circuit structure of a vehicle battery can be simplified and cost down.

In a first aspect, the present invention provides a high-voltage detection circuit, including: a controller including a first signal input port, a second signal input port, and a signal output port; a current detection sub-circuit, configured to sample a current signal of an internal side of a main negative switch and transmit the current signal to the first signal input port; a switch detection sub-circuit, wherein a first end of the switch detection sub-circuit is configured to sample a first electric signal of an external side of a to-be-detected switch, and a second end of the switch detection sub-circuit is configured to transmit the first electric signal to the second signal input port; and a switch driving sub-circuit, configured to sample a switch control signal via the signal output port and generate a switch driving signal according to the switch control signal.

Optionally, the high-voltage detection circuit further includes a to-be-controlled switch connected to the switch driving sub-circuit, wherein the to-be-controlled switch is configured to sample the switch driving signal and be opened or closed according to the switch driving signal.

Optionally, the number of the to-be-detected switch is at least one, and the at least one to-be-detected switch includes at least one of a pre-charging switch, a slow-charging switch, a heating switch, the main negative switch, a main positive switch and a fast-charging switch; the number of the to-be-controlled switch is at least one, and the at least one to-be-controlled switch includes at least one of a pre-charging switch, a slow-charging switch, a heating switch, the main negative switch, the main positive switch and a fast-charging switch.

Optionally, the at least one to-be-detected switch includes at least one of a relay and a metal oxide semiconductor (MOS) transistor; and the at least one to-be-controlled switch includes at least one of a relay and a MOS transistor.

Optionally, the number of the switch detection sub-circuit is one or more, and the number of the second signal input port is one or more, a first end of each switch detection sub-circuit is configured to sample the first electric signal of an external side of the to-be-detected switch, and a second end of each switch detection sub-circuit is configured to transmit the first electric signal sampled to the second signal input port; the number of the switch driving sub-circuit is one or more, the number of the signal output port is one or more, and the number of the to-be-controlled switch is one or more, a first end of each switch driving sub-circuit is configured to sample the switch control signal via the signal output port, a second end of each switch driving sub-circuit is configured to transmit the switch driving signal to the to-be-controlled switch.

Optionally, the switch detection sub-circuit corresponding to the main negative switch includes: a capacitor, a first end of the capacitor being connected to an external side of the main negative switch; a first resistor, a first end of the first resistor being connected to a second end of the capacitor; a first switch, a first end of the first switch being connected to a second end of the first resistor, and a second end of the first switch being connected to a power supply; a second resistor, a first end of the second resistor being connected to the second end of the capacitor; a third resistor, a first end of the third resistor being connected to a second end of the second resistor and being connected to the controller, and a second end of the third resistor being grounded.

Optionally, the switch detection sub-circuit corresponding to the to-be-detected switch, except the switch detection sub-circuit corresponding to the main negative switch, includes: a first voltage-division component, a first end of the first voltage-division component being connected to an external side of the respective to-be-detected switch; a second voltage-division component, a first end of the second voltage-division component being connected to a second end of the first voltage-division component and being connected to the controller, and a second end of the second voltage-division component being grounded.

Optionally, the first voltage-division component includes: at least one resistor; and/or, at least one resistor array; the second voltage-division component includes: at least one resistor; and/or, at least one resistor array.

Optionally, the current detection sub-circuit includes a current detection component, a first end of the current detection component is connected to a negative electrode of the battery module, a second end of the current detection component is connected to an internal side of the main negative switch, and both a third end of the current detection component and a fourth end of the current detection component are connected to the controller.

Optionally, the current detection component includes a current shunt, the current shunt includes an internal resistor, a first end of the current shunt is connected to the negative electrode of the battery module, a second end of the current shunt is in point-to-point contact with the internal side of the main negative switch, and two ends of the internal resistor of the current shunt are connected to the controller.

Optionally, the current detection sub-circuit further includes a first temperature sensing component connected to the controller and disposed at a position outside the current shunt and in contact with the internal resistor of the current shunt.

Optionally, the first temperature sensing component is a negative temperature coefficient thermistor.

Optionally, the controller further includes a third signal input port, and the high-voltage detection circuit further includes a battery module detection sub-circuit, a first end of the battery module detection sub-circuit is configured to sample a second electric signal of a positive electrode of the battery module, and a second end of the battery module detection sub-circuit is configured to transmit the second electric signal to the third signal input port.

Optionally, the battery module detection sub-circuit includes: a third voltage-division component, including at least one resistor and/or at least one resistor array, a first end of the third voltage-division component is connected to the positive electrode of the battery module; a fourth voltage-division component, including at least one resistor and/or at least one resistor array, a first end of the fourth voltage-division component is connected to a second end of the third voltage-division component and to the controller, and a second end of the fourth voltage-division component is grounded.

Optionally, further including a second temperature sensing component, a first end of the second temperature sensing component is connected to a heating switch, and a second end of the second temperature sensing component is connected to the negative electrode of the battery module.

Optionally, the second temperature sensing component is a positive temperature coefficient thermistor.

Optionally, the high-voltage detection circuit further includes an isolation area, provided at an edge region where a battery high-voltage loop is connected to a battery low-voltage loop; the controller further includes a communication signal transceiver port, and a communication component, provided at a position where the isolation area is located, a first end of the communication component is connected to the communication signal transceiver port of the controller, and a second end of the communication component is connected to an external general control system.

Optionally, the communication component is an isolation chip.

Optionally, the controller further includes a power input port, and the high-voltage detection circuit further includes a power supply component, provided at the position where the isolation area is located and is connected to the power input port of the controller.

In a second aspect, the present invention provides a high-voltage detection circuit, including: a controller including a first signal input port, a second signal input port, and a signal output port; a current detection sub-circuit, wherein a first end of the current detection sub-circuit is connected to the first signal input port of the controller, and a second end of the current detection sub-circuit is connected to an internal side of a main negative switch in a battery high-voltage loop; a switch detection sub-circuit, wherein a first end of the switch detection sub-circuit is connected to a to-be-detected switch in the battery high-voltage loop, and a second end of the switch detection sub-circuit is connected to the second signal input port of the controller; and a switch driving sub-circuit, wherein a first end of the switch driving sub-circuit is connected to the signal output port of the controller, and a second end of the switch driving sub-circuit is connected to a to-be-controlled switch in the battery high-voltage loop.

In a third aspect, the present invention provides a detector, including the high-voltage detection circuit described above.

In a fourth aspect, the present invention provides a battery device, including the high-voltage detection circuit described above.

In a fifth aspect, the present invention provides a vehicle, including the high-voltage detection circuit described above.

In addition, the present invention further provides a circuit board for integrating a battery high-voltage loop or a detection circuit of the battery high-voltage loop, including the high-voltage detection circuit described above.

For the technical problem existing in the related art that the internal circuit structure of a vehicle battery is excessively complicated, with the above technical solution, the internal circuit structure of a vehicle battery can be simplified. The current detection sub-circuit, the switch driving sub-circuit and the switch detection sub-circuit in the battery high-voltage loop, which are mutual independent with respect to each other, can be integrated together. The current detection sub-circuit, the switch detection sub-circuit and the switch driving sub-circuit each are connected to the controller originally used to control the current detection sub-circuit. The manner of connecting to the controller substitutes for the existing manner of connecting to the BMU, the controller can control to detect the current signal of the internal side of the main negative switch in the voltage loop, and the controller also can detect the working status of the to-be-detected switch in the battery high-voltage loop through the switch detection sub-circuit, and the controller also can send a switch control signal to the switch driving sub-circuit based on the working status of the to-be-controlled switch, so as to allow the switch driving sub-circuit to drive the to-be-controlled switch to be opened or closed according to the switch control signal.

The to-be-detected switch and the to-be-controlled switch may include at least one same switch. For example, the controller can control to detect a current signal of the internal side of the main negative switch in the battery high-voltage loop, the controller can also detect the working status of the main negative switch via the switch detection sub-circuit, and the controller can also send a switch control signal to the switch driving sub-circuit based on the working status of the main negative switch, so that the switch driving sub-circuit drives the main negative switch to be opened or closed according to the switch control signal. Alternatively, the controller can control to detect a current signal of the internal side of the main negative switch in the battery high-voltage loop, the controller can also detect the working status of the slow-charging switch via the switch detection sub-circuit, and the controller can also send a switch control signal to the switch driving sub-circuit based on the working status of the slow-charging switch, so that the switch driving sub-circuit drives the slow-charging switch to be opened or closed according to the switch control signal.

In this way, for each switch detection sub-circuit and each switch driving sub-circuit, it does not need to be connected to the BMU of the low-voltage section, therefore, there is no need to provide an isolation unit as in the related art to isolate the high-voltage loop from the low-voltage section, which not only saves the cost of wires which might be necessary on the isolation unit and a long distance connection, but also improves the safety of the circuit. Meanwhile, on the basis of this, at least a transmission distance of the first electric signal of the external side of the to-be-detected switch and the switch control signal can be shortened, and energy loss during the transmission of the first electric signal of the external side of the to-be-detected switch and the switch control signal can be decreased, so that the detection result of the switch detection sub-circuit and the control of the switch driving sub-circuit with respect to the to-be-controlled switch are more accurate. In addition, the transmission rate of the first electric signal of the external side of the to-be-detected switch and the switch control signal can be increased, so that the detection function with respect to the to-be-detected switch 208 and the control function with respect to the to-be-controlled switch can be more efficient, thereby improving the overall operation performance of the battery.

BRIEF DESCRIPTION OF DRAWINGS

The accompanying drawings are briefly introduced as follows for a better comprehension of the present invention. It is appreciated that, the drawings are not intended to limit the present invention, those skilled in the art can also obtain other drawings without paying creative effort.

DESCRIPTION OF EMBODIMENTS

For better understanding of technical solutions of the present invention, embodiments of the present invention are described in detail with reference to the accompanying drawings.

It will be appreciated that the described embodiments are only a part of the embodiments of the present invention, rather than all of the embodiments. Based on the embodiments in the present invention, all other embodiments obtained without creative work by those of ordinary skill in the art belong to the scope of protection of the present invention.

The terms used in the embodiments of the present invention are merely for the purpose of describing specific embodiments, which are not intended to limit the present invention. Expressions "a", "an", and "the" in singular form as mentioned in the specification and claims are also intended to include their plural form, unless otherwise clearly noted in the context.

Figure 1:
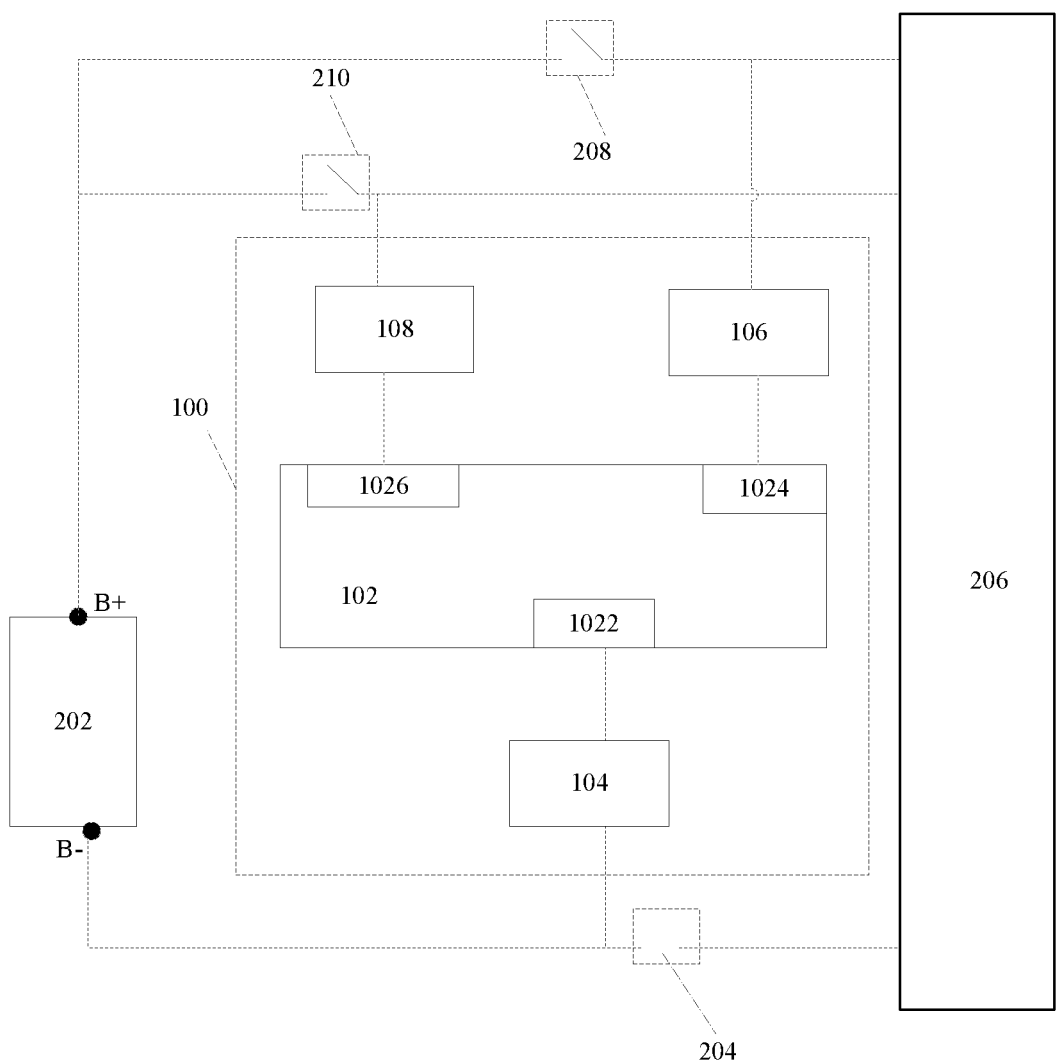
FIG. 1 illustrates an overall schematic diagram of a high-voltage detection circuit according to an embodiment of the present invention.

FIG. 1 illustrates an overall schematic diagram of a high-voltage detection circuit according to an embodiment of the present invention.

As shown in FIG. 1, the present invention provides a high-voltage detection circuit 100. The high-voltage detection circuit 100 includes a controller 102, a current detection sub-circuit 104, a switch detection sub-circuit 106 and a switch driving sub-circuit 108.

The controller 102 includes a first signal input port 1022, a second signal input port 1024 and a signal output port 1026. A first end of the current detection sub-circuit 104 is connected to the first signal input port 1022 of the controller 102, a second end of the current detection sub-circuit 104 is connected to an internal side of a main negative switch 204 in the battery high-voltage loop.

As described above, an end of a switch close to the battery module 202 is referred as an internal side of the switch, and the other end of the switch is referred as an external side of the switch. Herein the internal side of the main negative switch 204 refers to the end of the main negative switch 204 close to the battery module 202. In addition, there is another circuit 206 in the battery high-voltage loop, and the specific structure of the other circuit 206 is not shown in the figures.

The current detection sub-circuit 104 is configured to acquire a current signal of the internal side of the main negative switch 204 and then transmit the current signal to the first signal input port 1022. The controller 102 is configured to obtain the current signal via the first signal input port 1022. Since the internal side of the main negative switch 204 is connected to a negative electrode of the battery module 202, the controller 102 can determine whether the battery module 202 is in a normal working status according to the range of the current signal. That is, the controller 102 is capable of timely acquiring information of the current of a main circuit of the battery module 202, and can determine whether the battery module 202 or the entire battery high-voltage loop is in a normal working status according to the information of the current, so as to timely find out a possible malfunction, so that the safety of the battery high-voltage loop can be improved.

A first end of the switch detection sub-circuit 106 is connected to a to-be-detected switch 208 in the battery high-voltage loop, so as to acquire a first electric signal of the external side of the switch 208. A second end of the switch detection sub-circuit 106 is connected to the second signal input port 1024 of the controller 102, configured to transmit the first electric signal to the second signal input port 1024.

In this way, the switch detection sub-circuit 106 can transmit the acquired first electric signal to the controller 102 via the second signal input port 1024. The controller 102 can determine the actual working status of the to-be-detected switch 208 according to the first electric signal. Further, the controller 102 may compare the actual working status of the to-be-detected switch 208 with a theoretical working status of the to-be-detected switch 208. The theoretical working status is a working status in which the controller 102 or another controlling device in the battery high-voltage loop sends commands for controlling turn-on and turn-off of the to-be-detected switch 208. If the actual working status of the to-be-detected switch 208 is consistent with the theoretical working status of the to-be-detected switch 208, it indicates that the to-be-detected switch 208 is in a normal working status with no malfunction. If the actual working status of the to-be-detected switch 208 is not consistent with the theoretical working status of the to-be-detected switch 208, it indicates that the to-be-detected switch 208 is malfunctioned, such as welding, short circuit, etc. Therefore, the controller 102 can comprehensively control the actual working status of the to-be-detected switch 208, facilitating timely detection of the malfunction of the to-be-detected switch 208, thereby improving the efficiency of detecting and handling the malfunctions of the switch in the battery high-voltage loop.

A first end of the switch driving sub-circuit 108 is connected to the signal output port 1026 of the controller 102, a second end of the switch driving sub-circuit 108 is connected to a to-be-controlled switch 210 in the battery high-voltage loop, configured to acquire a switch control signal via the signal output port 1026 and generate a corresponding switch driving signal according to the switch control signal. The second end of the switch driving sub-circuit 108 may be connected to an external side of the to-be-controlled switch 210.

That is, the controller 102 sends a switch control signal to the switch driving sub-circuit 108 via the signal output port 1026. After obtaining the switch control signal, the switch driving sub-circuit 108 generates a corresponding switch driving signal according to the switch control signal and then transmits the switch driving signal to the to-be-controlled switch 210, so as to drive the to-be-controlled switch 210 to be opened or closed, thereby enhancing the control capability of the controller 102 in the battery high-voltage loop with respect to the to-be-controlled switch 210. For example, when the to-be-controlled switch 210 is a slow-charging switch, the switch driving sub-circuit 108 can be controlled by the controller 102 to control turn-on and turn-off of the slow-charging switch, so as to achieve the purpose of controlling the slow-charging function of the battery.

As described above, the current detection sub-circuit 104, the switch driving sub-circuit 108 and the switch detection sub-circuit 106, which are originally separated from one another in the battery high-voltage loop, can be integrated together. Each of the current detection sub-circuit 104, the switch detection sub-circuit 106 and the switch driving sub-circuit 108 is connected to the controller 102 originally used to control the current detection sub-circuit 104. The manner of connecting to the controller 102 substitutes for the existing manner of connecting to the BMU, the controller 102 can control to detect the current signal of the internal side of the main negative switch 204 in the voltage loop, and the controller 102 can also detect the working status of the to-be-detected switch 208 in the battery high-voltage loop through the switch detection sub-circuit 106 and, moreover, the controller 102 can also send a switch control signal to the switch driving sub-circuit 108 based on the working status of the to-be-controlled switch 210, so as to allow the switch driving sub-circuit 108 to drive the to-be-controlled switch 210 to be opened or closed according to the switch control signal.

In this way, for each switch detection sub-circuit 106 and each switch driving sub-circuit 108, it does not need to be connected to the BMU of the low-voltage section, therefore, there is no need to provide an isolation unit as in the related art to isolate the high-voltage loop from the low-voltage section, which not only saves the cost of wires which might be necessary on the isolation unit and a long distance connection, but also improves the safety of the circuit. Meanwhile, on the basis of this, at least a transmission distance of the first electric signal of the external side of the to-be-detected switch 208 and the switch control signal can be shortened, and energy loss during the transmission of the first electric signal of the external side of the to-be-detected switch 208 and the switch control signal can be decreased, so that the detection result of the switch detection sub-circuit 106 and the control of the switch driving sub-circuit 108 with respect to the to-be-controlled switch 210 are more accurate. In addition, the transmission rate of the first electric signal of the external side of the to-be-detected switch 208 and the switch control signal can be increased, so that the detection function with respect to the to-be-detected switch 208 and the control function with respect to the to-be-controlled switch 210 can be more efficient, thereby improving the overall operation performance of the battery.

Figure 2:
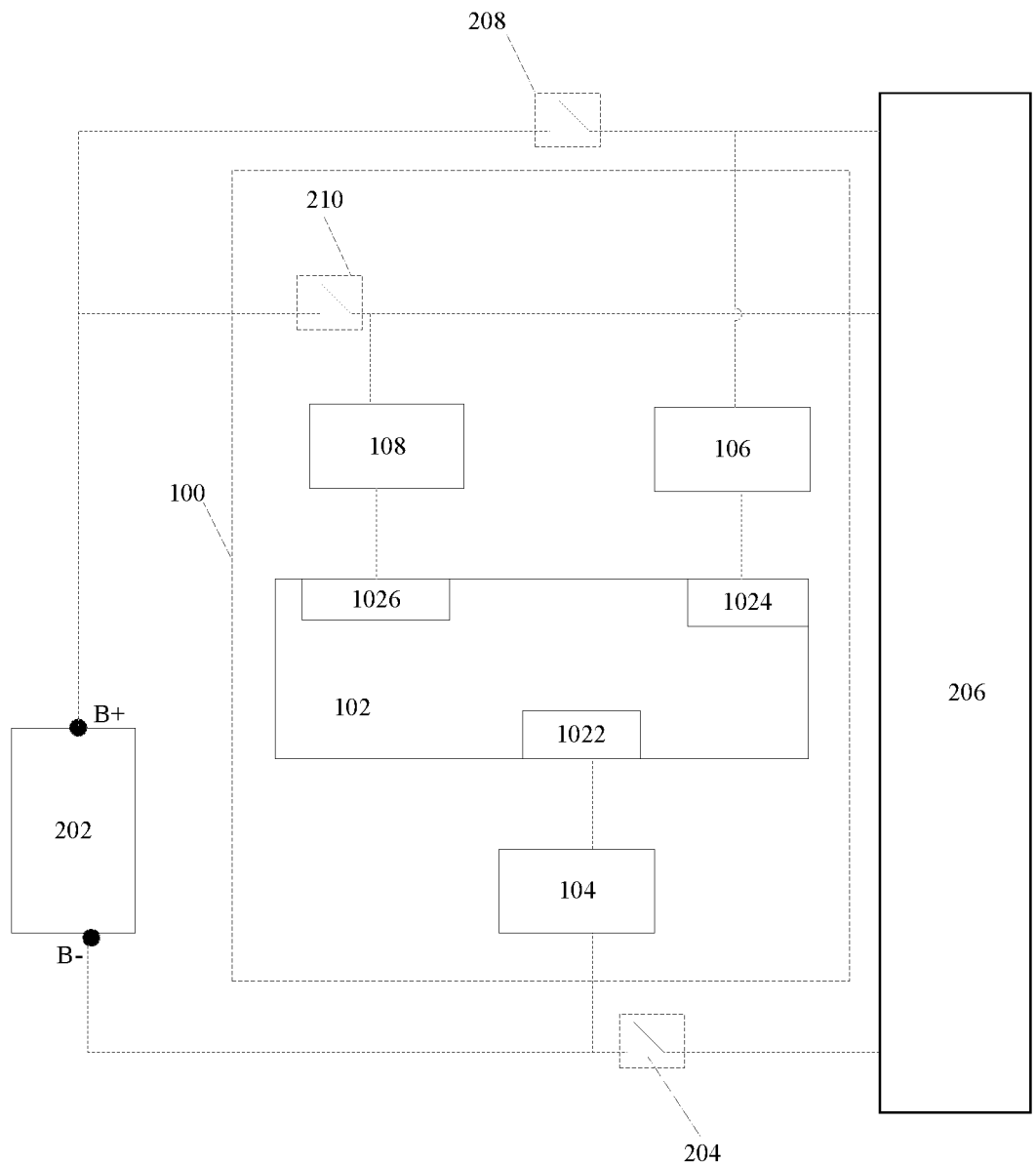
FIG. 2 illustrates a schematic diagram of a high-voltage detection circuit according to another embodiment of the present invention.

FIG. 2 illustrates a schematic diagram of a high-voltage detection circuit according to another embodiment of the present invention.

As shown in FIG. 2, on the basis of the structure shown in FIG. 1, it is also possible that the to-be-controlled switch 210 is directly disposed in the high-voltage detection circuit, the to-be-controlled switch 210 is connected to the switch driving sub-circuit 108 for acquiring the switch driving signal, and then the to-be-controlled switch 210 is opened or closed according to the switch driving signal.

That is, in the embodiment shown in FIG. 1, only the switch detection sub-circuit 106 and the switch driving sub-circuit 108 originally controlled by the BMU are integrated with the current detection sub-circuit 104 and controlled by the controller 102 that controls the current detection sub-circuit 104. In an embodiment shown in FIG. 2, the switch detection sub-circuit 106, the switch driving sub-circuit 108 and the to-be-controlled switch 210 driven by the switch driving sub-circuit 108 are all integrated with the current detection sub-circuit 104 and controlled by the controller 102 that controls the current detection sub-circuit 104, therefore, there is no need to provide an isolation unit as in the related art to isolate the parts (such as the switch detection sub-circuit 106, the switch driving sub-circuit 108 and the to-be-controlled switch 210) from the low-voltage section, there is no need to connect the battery high-voltage loop with the low-voltage section, which improves the safety of the circuit, at least shortens the transmission distance of the switch control signal, the first electric signal of the external side of the to-be-detected switch 208, and the switch driving signal obtained by the to-be-controlled switch 210, reduces energy loss of these signals during transmission, and saves the cost of wires which might be necessary on the isolation unit and a long distance connection. As a result, the detection results of the switch detection sub-circuit 106, the control of the switch driving sub-circuit 108 with respect to the to-be-controlled switch 210, and the opened/closed status control of the to-be-controlled switch 210 by itself, are more accurate. In addition, by shortening the wiring distance, the transmission rate of these signals is increased, the delay is shortened, so that the detection result of the switch detection sub-circuit 106, the control of the switch driving sub-circuit 108 with respect to the to-be-controlled switch 210, and the opened/closed status control of the to-be-controlled switch 210 by itself, are more timely and efficient, and thus enhancing the overall performance of the battery.

In one embodiment, the to-be-detected switch 208 and the to-be-controlled switch 210 include a relay and/or a MOS transistor (Metal Oxide Semiconductor Field Effect Transistor).

Both the relay and the MOS transistor can control a large current using a small signal. The relay is current-driven and has advantages of resistance to overcurrent and resistance to overheat, and can achieve electrical isolation, that is, it has low requirements on the environment. The MOS transistor is voltage-driven and can be qualified for a larger frequency range compared with the relay, and has a relatively low cost. In addition, the relay is prone to have a malfunction such as welding and the like after long time use, while the MOS transistor does not have these malfunctions, therefore, especially for a pre-charging switch, a slow-charging switch, and a heating switch which are frequently opened and closed, in order to avoid welding and other malfunctions, the MOS transistor may be used. The to-be-detected switch 208 and the to-be-controlled switch 210 may also be any other type of switch except the MOS transistor.

In the above embodiments, optionally, the to-be-detected switch 208 includes at least one of a pre-charging switch, a slow-charging switch, a heating switch, a main negative switch, a main positive switch and a fast-charging switch; the to-be-controlled switch 210 includes at least one of a pre-charging switch, a slow-charging switch, a heating switch, a main negative switch, a main positive switch, and a fast-charging switch.

It should be noted that, both the to-be-detected switch 208 and the to-be-controlled switch 210 may be selected from but are not limited to the switches listed above.

In one embodiment, the to-be-detected switch 208 and the to-be-controlled switch 210 may include at least one same switch. For example, the controller 102 can control to detect a current signal of the internal side of the main negative switch 204 in the battery high-voltage loop, the controller 102 can also detect the working status of the main negative switch 204 via the switch detection sub-circuit 106, and the controller 102 can also send a switch control signal to the switch driving sub-circuit 108 based on the working status of the main negative switch 204, so that the switch driving sub-circuit 108 drives the main negative switch 204 to be opened or closed according to the switch control signal. Alternatively, the controller 102 can control to detect a current signal of the internal side of the main negative switch 204 in the battery high-voltage loop, the controller 102 can also detect the working status of the slow-charging switch via the switch detection sub-circuit 106, and the controller 102 can also send a switch control signal to the switch driving sub-circuit 108 based on the working status of the slow-charging switch, so that the switch driving sub-circuit 108 drives the slow-charging switch to be opened or closed according to the switch control signal.

In one embodiment, one or more switch detection sub-circuits 106 are provided, and one or more second signal input ports 1024 are provided.

The first end of each switch detection sub-circuit is configured to acquire a first electric signal of the external side of the to-be-detected switch, and the second end of each switch detection sub-circuit is configured to transmit the acquired first electric signal to the second signal input port. In other words, each to-be-detected switch corresponds to a respective switch detection sub-circuit, and each switch detection sub-circuit corresponds to a respective second signal input port. In this way, each first electric signal from the respective switch detection circuit can be acquired via the respective second signal input port, so that the controller 102 can accurately identify the actual working status of each to-be-detected switch, thereby avoiding the situation that a plurality of to-be-detected switches shares only one second signal input port or only one switch detection sub-circuit, which may cause detection result confusion, and thus the accuracy of the detection with respect to the detection switch is improved, facilitating the controller 102 to further handle the to-be-detected switch.

Similarly, one or more switch driving sub-circuits 108, one or more signal output ports 1026, and one or more to-be-controlled switches 210 are provided.

The first end of each switch driving sub-circuit is configured to acquire a switch control signal via the signal output port, and the second end of each switch driving sub-circuit is configured to transmit the switch driving signal to the to-be-controlled switch. In other words, each to-be-controlled switch corresponds to a respective switch driving sub-circuit, and each switch driving sub-circuit corresponds to a respective signal output port. In this way, for different to-be-controlled switches, the respective switch control signal for each to-be-controlled switch can accurately control this to-be-controlled switch, avoiding the situation that the respective switch control signal for a certain to-be-controlled switch is erroneously transmitted to another to-be-controlled switch which does need to be controlled, thereby improving the control accuracy of the controller with respect to the to-be-controlled switch, and thus protecting safety of the battery.

Figure 3:
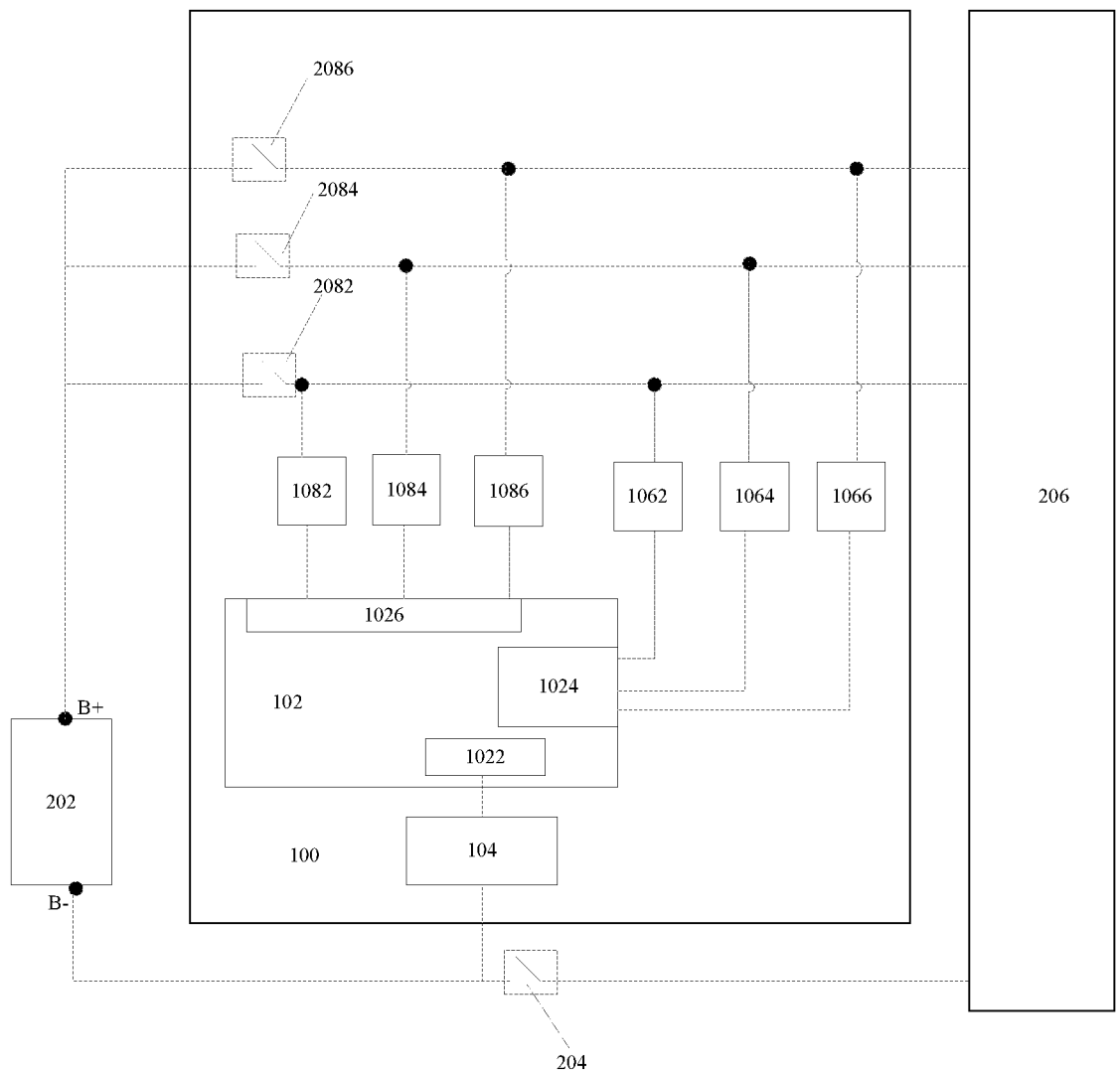
FIG. 3 illustrates a schematic diagram of a high-voltage detection circuit according to still another embodiment of the present invention.

In the case that the to-be-detected switches 208 include a pre-charging switch, a slow-charging switch and a heating switch, as shown in FIG. 3, the pre-charging switch 2082, the slow-charging switch 2084 and the heating switch 2086 are respectively connected to a pre-charging switch detection sub-circuit 1062, a slow-charging switch detection sub-circuit 1064 and a heating switch detection sub-circuit 1066. The to-be-controlled switches 210 also include a pre-charging switch 2082, a slow-charging switch 2084 and a heating switch 2086. An external side of the pre-charging switch 2082, an external side of the slow-charging switch 2084 and an external side of the heating switch 2086 are respectively connected to a pre-charging switch driving sub-circuit 1082, a slow-charging switch driving sub-circuit 1084 and a heating switch driving sub-circuit 1086.

Figure 4:
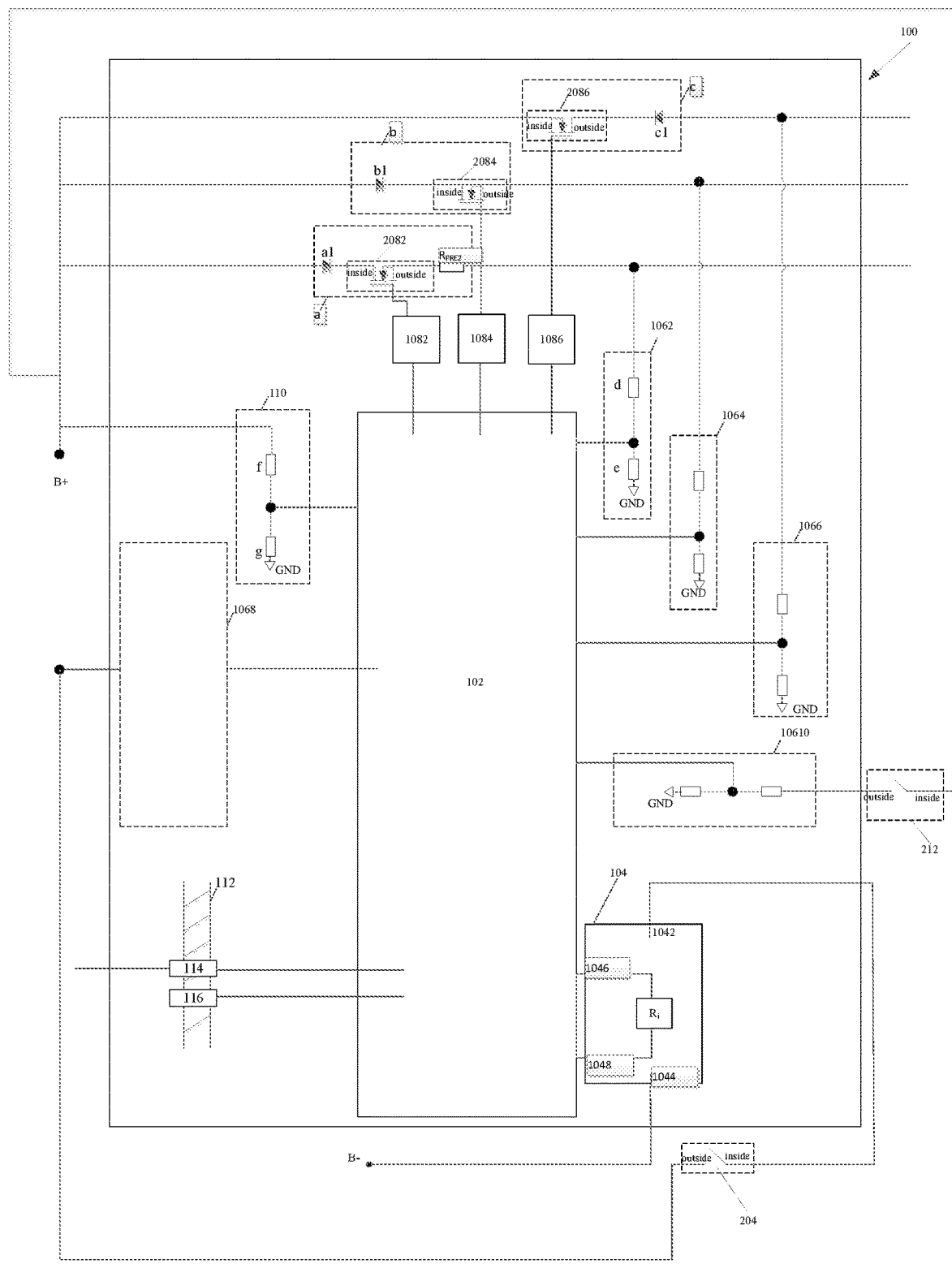
FIG. 4 illustrates a circuit diagram of a high-voltage detection circuit according to an embodiment of the invention.

In the cases that the to-be-detected switches 208 include a main negative switch, a fast-charging switch, a pre-charging switch, a slow-charging switch and a heating switch, as shown in FIG. 4, a main negative switch 204, a fast-charging switch 212, a pre-charging switch 2082, a slow-charging switch 2084 and a heating switch 2086 are respectively connected to a main negative switch detection sub-circuit 1068, a fast-charging switch detection sub-circuit 10610, a pre-charging switch detection sub-circuit 1062, a slow-charging switch detection sub-circuit 1064 and a heating switch detection sub-circuit 1066. The to-be-controlled switches 210 include a pre-charging switch 2082, a slow-charging switch 2084 and a heating switch 2086. The external side of the pre-charging switch 2082, the external side of the slow-charging switch 2084 and the external side of the heating switch 2086 are respectively connected to a pre-charging switch driving sub-circuit 1082, a slow-charging switch driving sub-circuit 1084 and a heating switch driving sub-circuit 1086.

It should be noted that, there may be various combinations of the to-be-detected switches 208 and the to-be-controlled switches 210, including but not limited to the combinations shown in FIG. 3 and FIG. 4. Each switch and the respective circuit will be further described in the following with reference to FIG. 4 and FIG. 5.

Firstly, the main negative switch 204 and its related main negative switch detection sub-circuit 1068 will be described in the following.

As shown in FIG. 4, the main negative switch detection sub-circuit 1068 includes: a capacitor C1, a first resistor R1, a first switch K1, a second resistor R2 and a third resistor R3. A first end of the capacitor C1 is connected to the external side of the main negative switch 204, a first end of the first resistor R1 is connected to a second end of the capacitor C1, a first end of the first switch is connected to a second end of the first resistor R1, a second end of the first switch is connected to a power supply V, a first end of the second resistor R2 is connected to the second end of the capacitor C1, a first end of the third resistor R3 is connected to both a second end of the second resistor R2 and the controller 102, and a second end of the third resistor R3 is grounded (shown as GND in FIG. 4). It should be noted that, the power supply V is a power supply device that can provide power, such as a constant voltage source, a constant current source, a direct current source, a battery, an energy storage system, and the like, which will not be limited by the embodiments of the present invention.

The working principle of the main negative switch detection sub-circuit 1068 is as follows.

1. Close the first switch K1 in response to obtaining a detection command from the main negative switch 204.

In an embodiment, when the first switch K1 is closed, a current flows from the power supply V to the negative electrode of the battery module 202 passing through the first switch K1, the first resistor R1, the capacitor C1, and the main negative switch 204, so as to form a complete charging loop. In this case, the power supply V can charge the capacitor C1 through the closed first switch K1.

2. Open the first switch K1 when the capacitor C1 is fully charged.

In an embodiment, the charging process of the capacitor C1 may be timed. In this way, when the charging time reaches a preset time, the capacitor C1 can be regarded as being fully charged.

At this time, open the first switch K1, and the capacitor C1 starts to discharge.

3. During the discharging process of the capacitor C1, at least two voltage signals are obtained through the end points of the controller 102 respectively connected to the second resistor R2 and the third resistor R3. The number of the obtained voltage signals and the obtaining frequency will not be limited by the present invention. The larger the number of the obtained voltage signals is, the more accurate the final detection result is.

4. Obtain the discharge capacitance value of the capacitor C1 according to the obtained voltage signals.

The discharge voltage value of the capacitor C1 can be obtained by processing the obtained voltage signal using the discharge formula and the voltage-division formula of the capacitor C1.

5. Detect whether the main negative switch 204 is malfunctioned according to the discharge capacitance value, the actual capacitance of the capacitor C1 and the theoretical working status of the main negative switch 204.

Based on the obtained discharge capacitance value, an error value between the discharge capacitance value and the actual capacitance value of the capacitor C1 can be obtained, and the error value is compared with a preset threshold value so as to obtain a comparison result. Therefore, whether the main negative switch 204 is malfunctioned is detected according to the comparison result and the theoretical working status of the main negative switch 204. In this case, there exist four cases as follows.

In a first case, when the theoretical working status of the main negative switch 204 is a closed status, if the error value is less than or equal to the preset threshold, it indicates that the discharge capacitance value of the capacitor C1 during the discharging process is close to the actual capacitance value of the capacitor C1. The discharge capacitance value of the capacitor C1 during the discharging process is close to the actual capacitance value of the capacitor C1 only if the capacitor C1 is in a normal charging status during the charging process, and the capacitor C1 is in a normal charging status only if the main negative switch 204 is in the closed status, therefore, the actual working status of the main negative switch 204 is a closed status, which is consistent with the theoretical working status, indicating that the main negative switch 204 has no malfunction.

In a second case, when the theoretical working status of the main negative switch 204 is a closed status, if the error value is larger than the preset threshold, it indicates that the discharge capacitance value of the capacitor C1 during the discharging process is substantially different from the actual capacitance value of the capacitor C1. The discharge capacitance value of the capacitor C1 during the discharging process is substantially different from the actual capacitance value of the capacitor C1 only if the capacitor C1 is in an abnormal charging status during the charging process, in this case, the capacitor C1 is in an abnormal charging status only if the main negative switch 204 is in an opened status, that is, the actual working status of the main negative switch 204 is an opened status, which is not consistent with the theoretical working status, indicating that the main negative switch 204 is disconnected.

In a third case, when the theoretical working status of the main negative switch 204 is an opened status, if the error value is less than or equal to the preset threshold, it indicates that the discharge capacitance value of the capacitor C1 during the discharging process is close to the actual capacitance value of the capacitor C1. The discharge capacitance value of the capacitor C1 during the discharging process is close to the actual capacitance value of the capacitor C1 only if the capacitor C1 is in a normal charging status during the charging process, and the capacitor C1 is in a normal charging status only if the main negative switch 204 is in the closed status, therefore, the actual working status of the main negative switch 204 is a closed status, which is not consistent with the theoretical working status, indicating that the main negative switch 204 is malfunctioned by welding.

In a fourth case, when the theoretical working status of the main negative switch 204 is an opened status, if the error value is larger than the preset threshold, it indicates that the discharge capacitance value of the capacitor C1 during the discharging process is substantially different from the actual capacitance value of the capacitor C1. The discharge capacitance value of the capacitor C1 during the discharging process is substantially different from the actual capacitance value of the capacitor C1 only if the capacitor C1 is in an abnormal charging status during the charging process, in this case, the capacitor C1 is in an abnormal charging status only if the main negative switch 204 is in an opened status, that is, the actual working status of the main negative switch 204 is an opened status, which is consistent with the theoretical working status, indicating that the main negative switch 204 is in normal operation.

Figure 5:
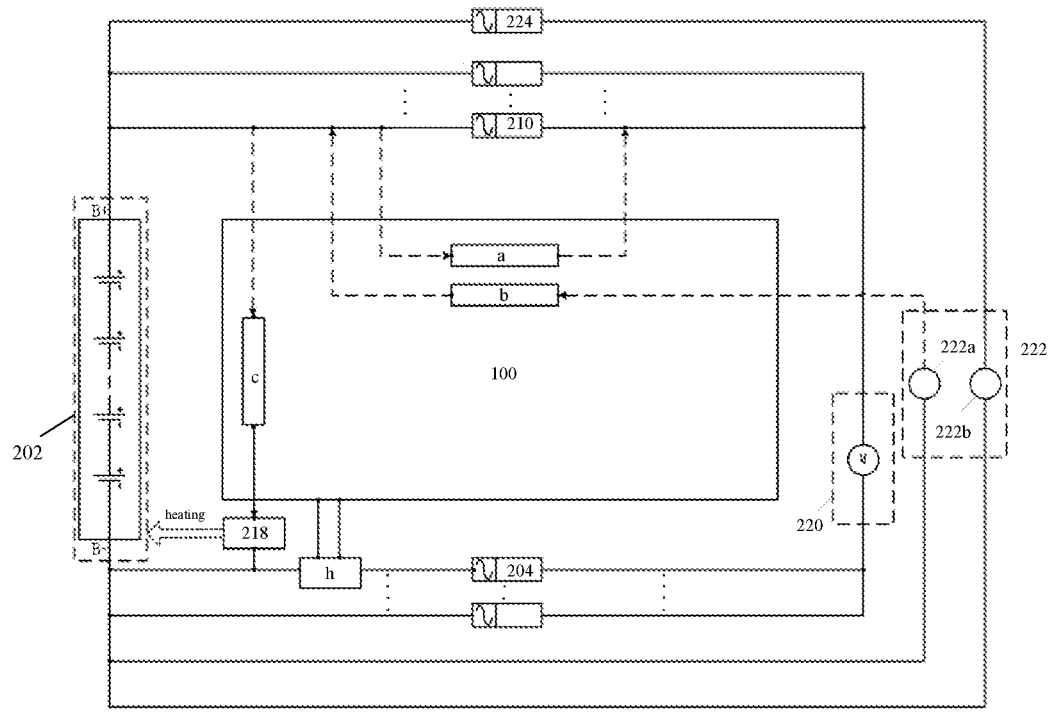
FIG. 5 illustrates an interactive circuit diagram of the high-voltage detection circuit of FIG. 4 with a battery module.

It should be noted that, in the high-voltage detection circuit 100 shown in the present invention, at least one switch (in addition to the main negative switch 204) connected to the negative electrode of the battery module 202 is provided. For example, another switch except the main negative switch 204 connected to the negative electrode of the battery module 202 is shown in FIG. 5, in this case, the principle and structure of the respective detection sub-circuit of each switch connected to the negative electrode of the battery module 202 may be the same as or similar to that of the main negative switch detection sub-circuit 106, which will not be further described herein.

Secondly, the pre-charging switch 2082, the slow-charging switch 2084, the heating switch 2086, the fast-charging switch 212 and the respective switch detection sub-circuit 106 will be described in the following.

As shown in FIG. 4, the high-voltage detection circuit 100 includes a pre-charging loop a, a slow-charging loop b and a heating loop c. The pre-charging switch 2082, the slow-charging switch 2084 and the heating switch 2086 are respectively disposed in the pre-charging loop a, the slow-charging loop b and the heating loop c. An anti-reverse connection unit a1, an anti-reverse connection unit b1 and an anti-reverse connection unit c1 are respectively disposed in the pre-charging loop a, the slow-charging loop b and the heating loop c. The anti-reverse connection unit a1, the anti-reverse connection unit b1 and the anti-reverse connection unit c1 may be but not limited to diodes. The circuit may be in an off-state when the pre-charging loop a, the slow-charging loop b and the heating loop c are reversely connected, so as to protect the safety of the circuit and thus the entire battery.

In addition, a pre-charging resistor $R_{PRE2}$ is provided in the pre-charging loop a, the pre-charging resistor RPRE2 is a single resistor or a resistor array, configured for limiting current of the pre-charging loop.

The fast-charging switch 212 is not arranged in the high-voltage detection circuit 100, but the fast-charging switch detection sub-circuit 10610 is arranged in the high-voltage detection circuit 100. In practice, in order to meet the actual requirements of the battery, the fast-charging switch 212 may also be arranged in the high-voltage detection circuit 100.

For the fast-charging switch 212, the pre-charging switch 2082, the slow-charging switch 2084 and the heating switch 2086, correspondingly, the fast-charging switch detection sub-circuit 10610, the pre-charging switch detection sub-circuit 1062, the slow-charging switch detection sub-circuit 1064 and the switch detection sub-circuit 1066 have a same structure. In FIG. 4, only an internal structure of the pre-charging switch detection sub-circuit 1062 is labeled, and the other switch detection sub-circuits have the same structure. Each switch detection sub-circuit includes a first voltage-division component d and a second voltage-division component e. A first end of the first voltage-division component d is connected to the external side of the to-be-detected switch, and a first end of the second-voltage division component e is connected to both a second end of the first voltage-dividing component d and the controller 102, and a second end of the second voltage-dividing component e is grounded.

The first voltage-division component d includes at least one resistor and/or at least one resistor array. The second voltage-division component e includes at least one resistor and/or at least one resistor array. The structures of the first voltage-dividing component d and the second voltage-dividing component e include but are not limited to the above embodiments.

For the fast-charging switch 212, firstly, a conduction voltage drop $\Delta U_{DC}=I_{DC}*R_{DC}$ can be calculated through a maximum fast-charging current $I_{DC}$ and a contact resistance $R_{DC}$. Then, a voltage difference between a positive electrode voltage $U_{B+}$ of the battery module 202 and the voltage $U_{DC\_OUTSIDE}$ of the external side of the fast-charging switch 212 is obtained, if the voltage difference is within a predetermined threshold range of the conduction voltage drop $\Delta U_{DC}$ of the fast-charging switch 212, it indicates that the fast-charging switch 212 is in normal work, otherwise, it indicates that the fast-charging switch 212 is malfunctioned.

For the pre-charging switch 2082, firstly, a pre-charging loop voltage drop $\Delta U_{PRE}=I_S*(R_{PRE1}+R_{PRE2})$ can be calculated through a maximum supply current $I_S$, a switch internal resistance $R_{PRE1}$ and a pre-charging resistance $R_{PRE2}$ of the battery Module 202. Then, a voltage difference between a positive electrode voltage $U_{B+}$ of the battery module 202 and the voltage $U_{PRE\_OUTSIDE}$ of the external side of the pre-charging switch 2082 is obtained, if the voltage difference is within a predetermined threshold range of the pre-charging loop voltage drop $\Delta U_{PRE}$, it indicates that the pre-charging switch 2082 is in normal work, otherwise, it indicates that the pre-charging switch 2082 is malfunctioned.

For the slow-charging switch 2084, firstly, a conduction voltage drop $\Delta U_{AC}=I_{AC}*R_{AC}$ can be calculated through a maximum slow-charging current $I_{AC}$ and a contact resistance $R_{AC}$ of the slow-charging switch 2084. Then, a voltage difference between a positive electrode voltage $U_{B+}$ of the battery module 202 and the voltage $U_{AC\_OUTSIDE}$ of the external side of the slow-charging switch 2084 is obtained, if the voltage difference is within a predetermined threshold range of the conduction voltage drop $\Delta U_{AC}$ of slow-charging switch 2084, it indicates that the slow-charging switch 2084 is in normal work, otherwise, it indicates that the slow-charging switch 2084 is malfunctioned.

For the heating switch 2086, firstly, a conduction voltage drop $\Delta U_{TEMP}=I_S*R_{TEMP}$ can be calculated through a maximum supply current $I_S$ and a switch internal resistance $R_{TEMP}$. Then, a voltage difference between a positive electrode voltage $U_{B+}$ of the battery module 202 and the voltage $U_{TEMP\_OUTSIDE}$ of the external side of the slow-charging switch 2084, if the voltage difference is within a predetermined threshold range of the conduction voltage drop $\Delta U_{TEMP}$ of the heating switch 2086, it indicates that the heating switch 2086 is in normal work, otherwise, it indicates that the heating switch 2086 is malfunctioned.

It should be noted that, a default value stored in the controller 102 can be taken as the positive electrode voltage $U_{B+}$ of the battery module 202 used in the status detection process for each of the above-mentioned switches, so as to save calculation time and improve response speed of the controller 102, so that the overall efficiency of the battery can be improved.

Thirdly, the main positive switch and its related battery module detection sub-circuit 110 will be described in the following.

As shown in FIG. 4, the controller 102 further has a third signal input port. The high-voltage detection circuit 100 further includes a battery module detection sub-circuit 110. A first end of the battery module detection sub-circuit 110 is configured to acquire a second electric signal of the positive electrode of the battery module 202, and a second end of the battery module detection sub-circuit 110 is configured to transmit the second electric signal to the third signal input port. The second electric signal of the positive electrode of the battery module 202 may correspond to the electric signal of the internal side of the main positive switch 224, i.e., the positive electrode voltage of the battery module 202. The battery module detection sub-circuit 110 transmits the second electric signal to the controller 102, so that the controller 102 further determines the working status of the main positive switch 224.

The battery module detection sub-circuit 110 includes a third voltage-division component f and a fourth voltage-division component g, a first end of the third voltage-division component f is connected to the positive electrode of the battery module 202 and includes at least one resistor and/or at least one resistor array. A first end of the fourth voltage-division component g is connected to both a second end of the third voltage-division component f and the controller 102. A second end of the fourth voltage-division component g is grounded (shown as GND in FIG. 4) and includes at least one resistor and/or at least one resistor array.

A conduction voltage drop $\Delta U_{MAIN+}=I_S*R_{MAIN+}$ can be calculated through a maximum supply current $I_S$ of the battery module 202 and a contact resistance $R_{MAIN+}$ of the main positive switch 224. Then, a voltage difference between the positive electrode voltage $U_{B+}$ of the battery module 202 and the voltage $U_{MAIN+\_OUTSIDE}$ of the external side of the main positive switch 224 is obtained. According to FIG. 5, it can be seen that, $U_{MAIN+\_OUTSIDE}$ is equal to the voltage $U_{PRE\_OUTSIDE}$ of the external side of the pre-charging switch 2082, is the voltage difference is within a predetermined threshold range of the conduction voltage drop $\Delta U_{MAIN+}$ of the main positive switch 224, it indicates that the main positive switch 224 is in normal work, otherwise, it indicates that the main positive switch 224 is malfunctioned.

Thus, the positive electrode voltage $U_{B+}$ of the battery module 202 used in the status detection process for each of the above-mentioned switches can be detected by using the battery module detection sub-circuit 110, so that the real-time positive electrode voltage of the battery module 202 can be obtained so as to adapt to a possible case that the voltage of the battery module 202 may become lower due to long-term use, and thus the most accurate real-time positive electrode voltage $U_{B+}$ can be obtained, thereby further improving the accuracy of the switch status detection.

It should be noted that, in the high-voltage detection circuit 100 shown in the embodiments, at least one switch (in addition to the main positive switch 224) connected to the positive electrode of the battery module 202 is provided. For example, another switch except the main positive switch 224 connected to the positive electrode of the battery module 202 is shown in FIG. 5, in this case, the principle and structure of the respective detection sub-circuit of each switch connected to the positive electrode of the battery module 202 may be the same as or similar to that of the main positive switch 224 detection sub-circuit 106, which will not be further described herein.

Fourthly, the pre-charging switch 2082, the slow-charging switch 2084, the heating switch 2086 and the respective switch driving sub-circuit will be described in the following.

As shown in FIG. 4, the pre-charging switch 2082 in the pre-charging loop a is a MOS transistor, which replaces a pre-charging relay used in the related art, so as to simplify the circuit and reduce the cost.

The pre-charging switch 2082 can be controlled to be opened or closed by the controller 102 via the pre-charging switch driving sub-circuit 1082. When the battery module 202 is in normal work, firstly close the main negative switch 204, and then close the pre-charging switch 2082, the capacitor is charged, after a period of time, open the pre-charging switch 2082, close the main positive switch, and the capacitor discharges. In this way, the inrush current and spike voltage generated when the battery module 202 momentarily supplies power can be effectively prevented from adversely affecting the internal circuits.

For the slow-charging loop b, the slow-charging switch 2084 is a MOS transistor, which replaces a slow-charging relay used in the related art, so as to simplify the circuit and reduce the cost.

The slow-charging switch 2084 can be controlled to be opened or closed by the controller 102 via the slow-charging switch driving sub-circuit 1084. When the slow-charging manner is used, the slow-charging switch 2084 is conducted and the fast-charging switch 212 is open. When the fast-charging manner is used, the slow-charging switch 2084 is opened and the fast-charging switch 212 is conducted. In this way, the demand for slow charging of the vehicle can be satisfied.

For the heating loop, the heating switch 2086 can be controlled to be opened or closed by the controller 102 via the heating switch driving sub-circuit 1086, so as to control the heating of the battery module 202, so that the power supply capability of the battery can be improved by heating the battery module 202 when the environment temperature is excessively low. Meanwhile, the heating switch 2086 may be a MOS transistor, which replaces a heating relay used in the related art, so as to simplify the circuit and reduce the cost.

Fifthly, the current detection sub-circuit 104 will be described in the following.

As shown in FIG. 4 and FIG. 5, the current detection sub-circuit 104 includes a current detection component, a first end 1042 of the current detection component is connected to the internal side of the main negative switch 204, a second end 1044 of the current detection component is connected to the negative electrode of the battery module 202, and both a third end 1046 and a fourth end 1048 of the current detection component are connected to the controller 102.

The current detection component includes but is not limited to a current shunt h, and may be any other device or circuit capable of performing current detection. When the current detection component is a current shunt, the current shunt has an internal resistor $R_i$, a second end of the current shunt is connected to the negative electrode of the battery module 202, and a first end of the current shunt is connected to the internal side of the main negative switch 204, and the internal side of the main negative switch 204 is connected to the main negative switch detection sub-circuit 1068.

Two ends of the internal resistor $R_i$ of the current shunt are connected to the controller 102.

When the main positive switch and the main negative switch 204 are closed, the controller 102 acquires a potential difference $U_1-U_2$ between two ends of the internal resistor through the current shunt and calculates the current of the battery module 202 by dividing the potential difference $U_1-U_2$ by the resistance $R_0$ of the internal resistor, so as to achieve detection with respect to the current.

The current detection sub-circuit 104 further includes a first temperature sensing component connected to the controller 102 and disposed at a position outside the current shunt and in contact with the internal resistor of the current shunt. The first temperature sensing component is a negative temperature coefficient thermistor, that is, the resistance of the first temperature sensing component decreases as the temperature increases, so that the controller 102 can acquire a resistance change of the first temperature sensing component and determine the temperature change according to this resistance change, that is, temperature change can be detected as the temperature in the circuit increases, thereby facilitating further control of the current in the battery module 202. For example, disconnecting the high-voltage loop or reducing the current of the battery module 202 when the temperature is excessively high. It should be noted that, the present invention focus on that the current detection sub-circuit 104 and the switch driving sub-circuit 108 are controlled simultaneously by the controller 102 of the current detection sub-circuit 104. The manner of current detection and the control of the current by the controller 102 are not limited in the present invention. That is, the current detection of the battery module 202 and the corresponding control can be implemented in any manner in the present invention.

As shown in FIG. 4, the high-voltage detection circuit 100 further includes an isolation area 112, a communication component 114 and a power supply component 116.

The isolation area 112 is disposed at the edge region where the battery high-voltage loop is connected to the battery low-voltage loop, so as to separate the battery high-voltage loop from the battery low-voltage loop, thereby improving the safety of the battery.

The controller 102 further includes a communication signal transceiver port. The communication component 114 is disposed at the position of the isolation area 112. A first end of the communication component 114 is connected to the communication signal transceiver port. A second end of the communication component 114 is connected to an external general control system for communicating and interacting with the external general control system, and the contents of communicating and interacting include but are not limited to the detection result of the current detection sub-circuit 104 and the opened/closed status of the to-be-controlled switch. The external general control system includes but is not limited to a battery management system, a vehicle overall management system and a mobile terminal. The communication component 114 includes but is not limited to an isolation chip.

The controller 102 further includes a power input port, the power supply component 116 is disposed at the position of the isolation area 112 and connected to the power input port of the controller 102 for supplying power the controller 102.

Finally, it should be noted that, as shown in FIG. 5, the current shunt h is shown separately from the high-voltage detection circuit 100, but the current shunt h is still a part of the high-voltage detection circuit 100.

The heating loop c is further connected to a second temperature sensing component 218. The second temperature sensing component 218 is a positive temperature coefficient thermistor for detecting the temperature of the battery module 202, decreasing as the temperature of the battery module 202 decreases, thus increasing the passing-through current, resulting in heat dissipation. In this way, the controller 102 may determine the temperature of the battery module 202 according to the resistance of the second temperature sensing component 218, so that when the temperature of the battery module 202 is lower than a predetermined normal operating temperature, the heating switch 2086 may be closed, the heating loop may be turned on, and the battery module 202 can be heated by the heat dissipation of the second temperature sensing component 218.

The battery module 202 is further connected to an electric device 220 which is connected to a load, which can achieve discharge of the battery module 202. The battery module 202 is further connected to a main positive switch and a main negative switch 204, configured for overload protection with respect of the electric device 220.

The battery module 202 is further connected to a charging device 222. The charging device 222 includes an AC charging device 222a and a DC charging device 222c. The charging device 222 is connected to both the fast-charging switch 212 and the slow-charging switch for charging the battery module 202.

Figure 6:
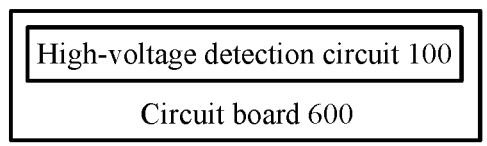
FIG. 6 illustrates a block diagram of a circuit board according to an embodiment of the present invention.

FIG. 6 illustrates a block diagram of a circuit board according to an embodiment of the present invention;

As shown in FIG. 6, a circuit board 600 according to an embodiment of the present invention includes the high-voltage detection circuit 100 shown in any one of FIGS. 1-5. Therefore, the circuit board 600 has the same technical effects as that of the high-voltage detection circuit 100 illustrated in any one of the embodiments of FIGS. 1-5, which will not be further described herein.

Figure 7:
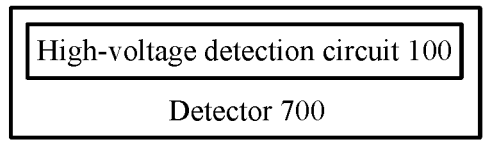
FIG. 7 illustrates a block diagram of a detector according to an embodiment of the present invention.

FIG. 7 illustrates a block diagram of a detector according to an embodiment of the present invention.

As shown in FIG. 7, a detector 700 according to an embodiment of the present invention includes the high-voltage detection circuit 100 shown in any one of FIGS. 1-5. Therefore, the detector 700 has the same technical effects as that of the high-voltage detection circuit 100 illustrated in any one of the embodiments of FIGS. 1-5, which will not be further described herein.

Figure 8:
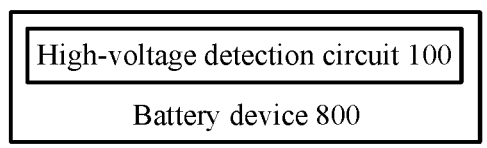
FIG. 8 illustrates a block diagram of a battery device according to an embodiment of the present invention.

FIG. 8 illustrates a block diagram of a battery device according to an embodiment of the present invention;

As shown in FIG. 8, a battery device 800 according to an embodiment of the present invention includes the high-voltage detection circuit 100 shown in any one of FIGS. 1-5. Therefore, the battery device 800 has the same technical effects as that of the high-voltage detection circuit 100 illustrated in any one of the embodiments of FIGS. 1-5, which will not be further described herein.

Figure 9:
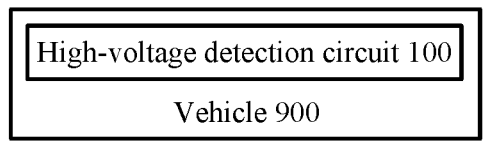
FIG. 9 illustrates a block diagram of a vehicle according to an embodiment of the present invention.

FIG. 9 illustrates a block diagram of a vehicle according to an embodiment of the present invention As shown in FIG. 9, a vehicle 900 according to an embodiment of the present invention includes the high-voltage detection circuit 100 shown in any one of FIGS. 1-5. Therefore, the vehicle 900 has the same technical effects as that of the high-voltage detection circuit 100 illustrated in any one of the embodiments of FIGS. 1-5, which will not be further described herein. The vehicle 900 includes but is not limited to an electric vehicle and a hybrid vehicle.

The technical solutions of the present invention are described in detail with reference to the accompanying drawings. With the technical solutions of the present invention, at least the transmission distance of the first electric signal of the external side of the to-be-detected switch and the switch control signal can be shortened, and energy loss during the transmission of the first electric signal of the external side of the to-be-detected switch and the switch control signal can be decreased, so that the detection result of the switch detection sub-circuit and the control of the switch driving sub-circuit with respect to the to-be-controlled switch are more accurate. In addition, the transmission rate of the first electric signal of the external side of the to-be-detected switch and the switch control signal can be increased, so that the detection function with respect to the to-be-detected switch and the control function with respect to the to-be-controlled switch can be more efficient, thereby improving the overall operation performance of the battery.

It should be understood that, although the terms "first", "second", etc. may be used in the embodiments of the present invention to describe the concept of a signal input port, an electric signal, a voltage-dividing component and the like, the concept should not be limited to these terms. For example, a first signal input port may also be referred to as a second signal input port without departing from the scope of the embodiments of the present invention. Similarly, a second signal input port may also be referred to as a first signal input port.

Depending on the context, the word "if" as used herein may be interpreted as "when" or "in a case that" or "in response to determination of" or "in response to detection of". Similarly, depending on the context, the phrase "if determined" or "if detected (stated condition or event)" may be interpreted as "when determined" or "in response to determination of" or "when detected (stated condition or event)" or "in response to detection of (stated condition or event)".

The above description is merely illustrative of the preferred embodiments of the present invention, but is not intended to limit the present invention. Within the principles of the present invention, any modifications, equivalent substitutions and improvements etc., should be included within the scope of protection of the present invention.

What is claimed is:

1. A high-voltage detection circuit, applied to a high-voltage loop of a vehicle power battery, the vehicle power battery comprising a battery module, the high-voltage detection circuit comprising:
   a controller comprising a first signal input port, a second signal input port, and a signal output port;
   a current detection sub-circuit, configured to sample a current signal of an internal side of a main negative switch of the high voltage loop and transmit the current signal to the first signal input port of the controller, wherein the internal side of the main negative switch is an end of the main negative switch close to the battery module;
   a switch detection sub-circuit, wherein a first end of the switch detection sub-circuit is configured to sample a first electric signal of an external side of a to-be-detected switch away from the battery module, and a second end of the switch detection sub-circuit is configured to transmit the first electric signal to the second signal input port of the controller; and
   a switch driving sub-circuit, configured to sample a switch control signal via the signal output port of the controller and generate a switch driving signal according to the switch control signal.

2. The high-voltage detection circuit according to claim 1, further comprising:
   a to-be-controlled switch connected to the switch driving sub-circuit, wherein the to-be-controlled switch is configured to sample the switch driving signal and be opened or closed according to the switch driving signal.

3. The high-voltage detection circuit according to claim 2, wherein
   the number of the to-be-detected switch is at least one, and the at least one to-be-detected switch comprises at least one of a pre-charging switch, a slow-charging switch, a heating switch, the main negative switch, a main positive switch and a fast-charging switch;
   the number of the to-be-controlled switch is at least one, and the at least one to-be-controlled switch comprises at least one of a pre-charging switch, a slow-charging switch, a heating switch, the main negative switch, the main positive switch and a fast-charging switch.

4. The high-voltage detection circuit according to claim 3, wherein
   the at least one to-be-detected switch comprises at least one of a relay and a metal oxide semiconductor (MOS) transistor; and
   the at least one to-be-controlled switch comprises at least one of a relay and a MOS transistor.

5. The high-voltage detection circuit according to claim 2, wherein
   the number of the switch detection sub-circuit is one or more, and the number of the second signal input port of the controller is one or more, a first end of each switch detection sub-circuit is configured to sample the first electric signal of an external side of the to-be-detected switch, and a second end of each switch detection sub-circuit is configured to transmit the first electric signal sampled to the second signal input port of the controller;
   the number of the switch driving sub-circuit is one or more, the number of the signal output port of the controller is one or more, and the number of the to-be-controlled switch is one or more, wherein a first end of each switch driving sub-circuit is configured to sample the switch control signal via the signal output port of the controller, a second end of each switch driving sub-circuit is configured to transmit the switch driving signal to the to-be-controlled switch.

6. The high-voltage detection circuit according to claim 1, wherein the switch detection sub-circuit corresponding to the to-be-detected switch, except the switch detection sub-circuit corresponding to the main negative switch, comprises:
   a first voltage-division component, a first end of the first voltage-division component being connected to an external side of the respective to-be-detected switch;
   a second voltage-division component, a first end of the second voltage-division component being connected to a second end of the first voltage-division component and being connected to the controller, and a second end of the second voltage-division component being grounded.

7. The high-voltage detection circuit according to claim 6, wherein
   the first voltage-division component comprises: at least one resistor; and/or, at least one resistor array;
   the second voltage-division component comprises: at least one resistor; and/or, at least one resistor array.

8. The high-voltage detection circuit according to claim 1, wherein the controller further comprises a third signal input port, and the high-voltage detection circuit further comprises:
   a battery module detection sub-circuit, a first end of the battery module detection sub-circuit is configured to sample a second electric signal of a positive electrode of the battery module, and a second end of the battery module detection sub-circuit is configured to transmit the second electric signal to the third signal input port.

9. The high-voltage detection circuit according to claim 8, wherein the battery module detection sub-circuit comprises:
   a third voltage-division component, comprising at least one resistor and/or at least one resistor array, wherein a first end of the third voltage-division component is connected to the positive electrode of the battery module;
   a fourth voltage-division component, comprising at least one resistor and/or at least one resistor array, wherein a first end of the fourth voltage-division component is connected to both a second end of the third voltage-division component and to the controller, and a second end of the fourth voltage-division component is grounded.

10. The high-voltage detection circuit according to claim 1, wherein the high-voltage detection circuit further comprises:
- an isolation area, provided at an edge region where a battery high-voltage loop is connected to a battery low-voltage loop; the controller further comprises a communication signal transceiver port, and
- a communication component, provided at a position where the isolation area is located, wherein a first end of the communication component is connected to the communication signal transceiver port of the controller, and a second end of the communication component is connected to an external general control system.

11. The high-voltage detection circuit according to claim 10, wherein the controller further comprises a power input port, and the high-voltage detection circuit further comprises:
- a power supply component, provided at the position where the isolation area is located and is connected to the power input port of the controller.

12. A high-voltage detection circuit, comprising:
- a controller comprising a first signal input port, a second signal input port, and a signal output port;
- a current detection sub-circuit, wherein a first end of the current detection sub-circuit is connected to the first signal input port of the controller, and a second end of the current detection sub-circuit is connected to an internal side of a main negative switch in a battery high-voltage loop;
- a switch detection sub-circuit, wherein a first end of the switch detection sub-circuit is connected to a to-be-detected switch in the battery high-voltage loop, and a second end of the switch detection sub-circuit is connected to the second signal input port of the controller;
- a switch driving sub-circuit, wherein a first end of the switch driving sub-circuit is connected to the signal output port of the controller, and a second end of the switch driving sub-circuit is connected to a to-be-controlled switch in the battery high-voltage loop.

13. A battery device, comprising the high-voltage detection circuit according to claim 1.

\* \* \* \* \*